United States Patent [19]

Ohashi et al.

[11] Patent Number: 5,514,477

[45] Date of Patent: May 7, 1996

[54] CORROSION-RESISTANT LAMINATE WHICH CONSISTS OF A METAL OF A SINGLE MASS NUMBER DEPOSITED ON A SUBSTRATE

[75] Inventors: Kenya Ohashi; Kiyoshi Miyake; Noriyuki Ohnaka, all of Katsuta; Moriaki Fuyama, Hitachi, all of Japan

[73] Assignee: Hitachi, Ltd., Tokyo, Japan

[21] Appl. No.: 118,640

[22] Filed: Sep. 10, 1993

[30] Foreign Application Priority Data

Sep. 11, 1992 [JP] Japan .................. 4-243028

[51] Int. Cl.$^6$ ........................... G11B 5/00
[52] U.S. Cl. ............. 428/457; 428/694 T; 428/900; 428/928
[58] Field of Search .............. 428/457, 900, 428/694 T, 928

[56] References Cited

U.S. PATENT DOCUMENTS

| | | | |
|---|---|---|---|
| 4,675,240 | 6/1987 | Weiss | 428/611 |
| 4,794,047 | 12/1988 | Funamoto | 428/408 |
| 5,313,067 | 5/1994 | Houk et al. | 250/452.21 |

FOREIGN PATENT DOCUMENTS

| | | |
|---|---|---|
| 0485729 | 5/1992 | European Pat. Off. . |
| 60-231924 | 11/1985 | Japan . |
| 61-87871 | 5/1986 | Japan . |

OTHER PUBLICATIONS

"Ultrapure Iron Film Formation by Mass–Separated Ion Beam Deposition Method" by Kiyoshi Miyake, et al Presented at The 1992 MRS Fall Meeting, 3 Dec. 1992, Paper A17.12.

Patent Abstracts of Japan, Unexamined Applications, P Section, vol. 10, No. 101, Apr. 17, 1986; p. 30, P 447 No. 60–231 924 (Taiyou Yuuden).

Patent Abstracts of Japan, Unexamined Applications, C Section, vol. 10, No. 262, Sep. 6, 1986; p. 91, P 447 No. 61-87 871 (Seiko Epson Corp.).

"Electron/Ion Beam Handbook (The Second Edition)" Edited by The 132nd Committee of Japan Society for the Promotion of Science and Published by Nikkan Kogyo Shinbunsha in 1986 (pp. 194–213) (With Translation).

Primary Examiner—Stevan A. Resan
Attorney, Agent, or Firm—Antonelli, Terry, Stout & Kraus

[57] ABSTRACT

A highly corrosive-resistant metal having a high purity and a specific plane index is manufactured by ion beam deposition (IBD). A thin film having less defects and impurities is obtained. A magnetoresistant effect film for a magnetoresistant effect type magnetic head which is highly corrosion-resistant and exhibits excellent characteristics can be formed. In IBD according to the present invention, metal ions are provided with adjusted ion energy of 10 to 100 eV, and a metal having a particular mass number is selected by a mass separation electromagnet.

6 Claims, 11 Drawing Sheets

CORROSION-RESISTANT LAMINATE WHICH CONSISTS OF A METAL OF A SINGLE MASS NUMBER DEPOSITED ON A SUBSTRATE

BACKGROUND OF THE INVENTION

FIELD OF THE INVENTION

The present invention relates in general to an improved metallic material which exhibits high corrosion resistance and, in particular, to a method of and an apparatus of manufacturing such a metallic material which are effective to improve corrosion resistance of magnetic materials and to improve reliability of structural materials, as well as use of such a metallic material.

Examples of conventional processes of forming a thin metallic film include plating (electrolytic plating) which utilizes electric field effect or chemical reaction in a solution, an evaporation process in which a film is formed under a vacuum by heating a metal serving as an evaporation source, and sputtering in which a film is formed from a metallic target by means of bombardment by gaseous particles. However, the electrolytic plating process which employs a solution suffers from technical disadvantages in that impurity ions in the aqueous solution enter the formed film and in that the formed film is physically unstable. The evaporation process is disadvantageous, because it is difficult to form a high purity metallic film due to entering of impurity gas molecules during evaporation. The ion beam deposition process (IBD process) is free from any of the above-mentioned problems, and thus allows the formation of a uniform thin film which contains less impurities.

The floating zone melting process is known as a process for improving the purity of metal.

The IBD process is disclosed in, for example, JP-A-60-231924 and JP-A-61-87871. The former patent discloses a magnetic iron film forming method in which iron having a purity of 99.9% is evaporated as an evaporation source, and at the same time ionized together with nitrogen gas and oxygen gas, and iron ions are irradiated onto a substrate to form a magnetic iron film. The latter patent proposes a method of depositing an organic metal or an alloy of organic metals on the surface of a substrate by irradiating an organic metal compound or a metal evaporation compound with an electron beam or an ion beam.

The ion source device employed in, for example, an ion beam apparatus of processing a method surface, an ion implanting apparatus used in manufacturing semiconductor devices, an ion beam deposition apparatus or an accelerator is constructed such that a substance containing the same elements as desired metal ions is placed in a crucible provided with a heater, and a metal evaporation containing a desired metal ion is generated by heating the crucible. The generated metal evaporation is sent to a discharge chamber to generate a discharge plasma containing metal ions, like the Freeman type ion source. It is described in FIG. 6.25 on page 203 of "Electron/Ion Beam Handbook (No. 2)" edited by the 132nd Committee of Japan Society for the Promotion of Science and published by Nikkan Kogyo Shinbunsha in 1986.

However, in IBD, the process of generating a metal ion beam to form a thin film has not yet been developed. Generation of a thin film of pure metal in the IBD process requires selection of a suitable metal compound used to generate metal ion and the provision of a plasma chamber having a configuration suited to extract the metal ion and to forward it to a substrate.

In addition, the film forming conditions must be set in order to form a film which is sufficiently corrosion-resistant to allow the film to be put into practical use.

Studies have been made about an increase in the corrosion-resistance of a thick metal film, e.g., a thick iron film, formed by the floating zone melting process by increasing the purity of iron. However, an increase in the corrosion-resistance of a thin film, such as a magnetic head film, has not been researched yet. Thus, the method of forming a corrosion-resistant thin metallic film has not been proposed yet, and it is thus difficult to form a corrosion-resistant thin metallic film which is the fundamental structural element of a magnetic film.

Furthermore, in conventional technology, a crucible which is highly heat-resistant and chemically stable at high temperatures is required in order to stably generate desired metal ions over a long time, and the temperature of the crucible must be controlled with a high degree of accuracy in order to maintain the pressure of the metal steam at a fixed value. Consequently, the ion source device has a complicated structure, making reduction in the size thereof difficult. It is also difficult to form a highly corrosion-resistant film.

SUMMARY OF THE INVENTION

One objective of the present invention resides in providing a metal or an alloy which is highly corrosion-resistant, a method and an apparatus for manufacturing the same, and a magnetic disk device which is provided with a magnetic head capable of reading data at a high sensitivity.

To achieve the above-described objective, the present invention provides a highly corrosion-resistant metal essentially having a single mass number and having a purity of 99.99% or above.

The present invention further provides a highly corrosion-resistant metal having a purity of 99.99% or above and a crystal grain size not greater than 50 nm.

The present invention still further provides a highly corrosion-resistant member in which a thin metallic film is formed on the surface of a substrate. The thin film comprises a metal of a single mass number or an alloy of a combination of a plurality of metals each metal having a single mass number.

The present invention still further provides a highly corrosion-resistant member in which a thin metallic film is formed on the surface of a substrate. The thin film is deposited with the closest packed surface thereof perpendicular to the depositing direction, and has a crystal grain size of not greater than 5 μm.

The present invention still further provides a method of manufacturing a highly corrosion-resistant metal which comprises the steps of ionizing a metal, separating a metal ion of a single mass number, and depositing the separated metal of the single mass number having adjusted ion energy in such a manner that no sputtering occurs.

The present invention still further provides a method of manufacturing a high corrosion-resistant metal which comprises the steps of ionizing a metal, separating a metal ion of a single mass number, and depositing the separated metal of the single mass number having adjusted ion energy of 1 to 200 eV.

The present invention still further provides a method of manufacturing a high corrosion-resistant metal which comprises the steps of ionizing a plurality of metals, separating metal ions each having a single mass number from metal ions, and alternately depositing the plurality of metals each of which has the single mass number having adjusted ion energy in such a manner that essentially no sputtering occurs.

The present invention still further provides a method of manufacturing a high corrosion-resistant member in which a thin metallic film is formed on the surface of a substrate which comprises the steps of separating a metal ion of a single mass number, and depositing the separated metal of the single mass number having adjusted ion energy on the surface of the substrate in such a manner that essentially no sputtering occurs.

The present invention still further provides a method of manufacturing a high corrosion-resistant member in which a thin metallic film is formed on the surface of a substrate, which comprises the step of depositing a metal having adjusted ion energy in such a manner that essentially no sputtering occurs.

The present invention provides an apparatus for manufacturing a metal which comprises a metal ion implanting chamber for depositing a metal on a substrate, a discharge chamber for forming metal ions, an ion acceleration power source for accelerating the metal ions, an ion beam transport pipe for introducing the accelerated metal ions into the metal ion implanting chamber, a drawing power source for accelerating and introducing the metal ions into the pipe at a high speed, a mass separation electromagnet for mass separating the metal ions introduced at a high speed, and a drawing voltage control lens for decelerating the mass separated metal ions.

The electromagnet has a means for switching a current.

The metal ion implanting chamber is provided with a substrate holding means for holding the substrate having a heater for heating the substrate.

The present invention provides a magnetic disk device with a magneto resistant effect type magnetic head provided thereon. The magnetic head has a structure in which a magnetic shield film, a lower gap film a domain control film, a magneto resistant effect film for converting a magnetic signal into an electrical signal utilizing a magneto resistant effect, a shunt film, a soft film and a pair of electrodes for supplying a signal detection current to the magneto resistant effect film are formed sequentially on a ceramic substrate. At least one of these films is made of either a metal having a single mass number or an alloy or a compound composed of a plurality of elements each of which has a single mass number.

The present invention further provides a magnetic disk device with a magnetoresistant effect type magnetic head provided thereon. The magnetic head has a magnetoresistant effect film for converting a magnetic signal into an electrical signal using a magneto resistant effect, a pair of electrodes for supplying a signal detection current to the magnetoresistant effect film, and a domain control layer for controlling a domain of the magnetoresistant effect film. The magnetoresistant effect film is made of a metal having a single mass number or an alloy composed of a plurality of metals each of which has a single mass number.

The present invention still further provides a magnetic disk device with a magnetoresistant effect type magnetic head provided thereon. The magnetic head has a magnetoresistant effect film for changing a direction of magnetization by sensing an external magnetization, a pair of electrodes for supplying a current to the magnetoresistant effect film, and a domain control layer for controlling a domain of the magneto resistant effect film. The magnetoresistant effect film is made of a metal or an alloy which is composed of fine crystal grains having a granular structure and whose deposited surface has a desired single plane index.

The present invention still further provides a magnetic disk device with a recording reproduction separation type thin-film magnetic head provided thereon. The magnetic head includes, as fundamental components, a reproduction head portion and a recording head portion. The reproduction head portion has a magnetoresistant effect film for converting a magnetic signal into an electrical signal using a magnetoresistant effect, a pair of electrodes for supplying a signal detection current to the magnetoresistant effect film and a domain control layer for controlling a domain of the magnetoresistant effect film. The recording head portion has a first magnetic pole, a second magnetic pole whose one end is in contact with the first magnetic pole and whose the other end is not in contact with the first magnetic pole to form a gap, and a coil wound between on the first and second magnetic poles to convert a current which flows in the coil into a magnetization. The magnetoresistive effect film has a thickness ranging from 5 to 100 nm and is made of a metal or an alloy having a fine granular structure.

The present invention is achieved by reducing an extracting voltage for metal ions obtained by ionizing metal atoms to a value which ensures that no sputtering or implantation occurs and by limiting a gas molecule density around a substrate on which a film is to be formed.

The ion energy must be 200 eV or below, preferably, between 10 and 200 eV, when the temperature of the substrate is near ambient temperature. The gas molecules in the film forming chamber are composed of nitrogen, oxygen, carbon dioxide and water molecules. The important factor for manufacturing a highly corrosion-resistant metal is to reduce the partial pressures of these substances, i.e., to reduce the gas density of the film forming chamber to $10^{-4}$ Pa or below, preferably, to $10^{-7}$ Pa or below by an evacuation devices.

The present inventors found that an alloy could be manufactured by IBD by heating the substrate when or after metal isotope ions are irradiated thereto. The present inventors studied the relation between the temperature and the ion energy when an alloy film was formed, and found that in the case of iron and nickel whose alloy ratio was 1:4, a film of Permalloy was formed at 200° C. and at 20 to 100 eV. When the temperature of the substrate is between 200° and 300° C., Permalloy of Fe and Ni is formed by alternately depositing Fe and Ni in layers each layer having a thickness corresponding to several atoms.

The present inventors examined the corrosion suppressing mechanism of the thin metallic film manufactured by the above-described thin metallic film manufacturing means, and found that the crystal structure of the surface of the thin metallic film took only a single crystal-orientation plane and that the metal surface was composed of fine crystal clusters each crystal having a size of 1 micron or below and thus had less defects. The present inventors consider that the regularly structured surface prevents entry of the molecules or ions of those substances and thus suppresses the reaction of anion, including oxygen, water or halogen, with the metal which progresses corrosion.

In a practical example of the present invention, a thin iron film is formed on a conductive substrate. The surface of the thin iron film is essentially made up of (110) planes. To form this thin iron film, iron is ionized, and the iron ions are irradiated onto the conductive substrate at an acceleration voltage of 10 volts to 200 volts to deposit iron atoms. Alternatively, a single type of iron isotope is selectively ionized from iron atoms having iron isotopes, and the iron ion of the single mass number is irradiated onto the conductive substrate at an acceleration voltage from 10 volts to 200 volts to deposit iron atoms. The iron ion is irradiated in an atmosphere in which the density of the gas molecules and floating atoms other than iron atoms around a substrate on which iron atoms are deposited is $3\times10^{12}$ pieces/cm$^3$ or below to deposit iron atoms. The temperature of the substrate on which iron ions are irradiated and thereby deposited is 300° C. or below, particularly, 200° C. or below.

At a high deposition energy, both granular structure and columnar structure exist in a mixed state. In a body-centered cubic lattice, as the ratio of (110)/((110)+(211)) reduces, the amount of corrosion increases. A desired ratio of (110) plane is 0.5 or above. In either lattice, the most desirable ratio of the closest packed surface is "1". However, corrosion resistance is improved when the ratio is 0.5 or above.

Furthermore, after the iron atom isotope is ionized, the iron ion deposition voltage is reduced to a value where neither sputtering nor implantation occurs, and the gas molecule density around the substrate on which a film is to be deposited is limited.

When the temperature of the substrate is near ambient temperature, a desired ion drawing energy is 200 V or below, with more preferable range between 10 and 100 V. The gas molecules in the film forming chamber are composed of nitrogen, oxygen, carbon dioxide or water molecules. The important factor for manufacturing a highly corrosion-resistant metal is to reduce the partial pressures of these substances, i.e., to reduce the gas density in the film forming chamber by an evacuation device.

Furthermore, in the manufacturing apparatus according to the present invention, iron ions of a particular mass number are directed toward the substrate by a magnet.

The present inventors examined the corrosion suppressing mechanism of the thin iron film manufactured by the above-described thin iron film manufacturing means, and found that the crystal structure of the surface of the thin iron film took the body-centered cubic lattice made up of (110) planes and that the iron surface was composed of fine crystal clusters each crystal having a size of 1 micron or below (particularly, from 0.01 to 0.5 μm) and thus had less defects. The present inventors consider that the regularly structured surface prevents entry of the molecules or ions of those substances and thus suppresses the reaction of anion, including oxygen, water or halogen, with the metal which progresses corrosion.

Iron compounds, such as $Fe_2O_3$, $Fe_3O_4$, $FeCl_3$ or $Fe(OH)_3$, are desirable as the iron ion source, and $CCl_4$ gas is preferable as the carrier gas. Deposition of a thin film is preferably performed under a super high vacuum of $10^{-4}$ Pa or above.

Although metals, alloys and inorganic compounds, such as oxides, nitride or carbide, can be deposited by the IBD method according to the present invention, deposition of elements having the mass number whose content is the largest among the elements which exist in the nature is desirable. The mass numbers of the major elements whose content is the largest are Mg24, Al27, Si28, Ti48, V51, Cr52, Mn55, Fe56, Ni58, Cu63, Zr90, Nb93, Mo98, Ru102, Ag107, Hf180, Ta181 and W184.

Applications of the IBD method according to the present invention include formation of a magnetoresistant effect film for a magnetoresistant effect type magnetic head. Particularly, a Fe—Ni type alloy (Permalloy) is formed as the magnetoresistive effect film by the IBD method according to the present invention. Alternatively, a thin iron film, having a high purity, mass number of 58 and plane index of (110), is formed to a thickness of 10 nm or below by the IBD process of the present invention on a Permalloy film formed by conventional sputtering, evaporation or electrolytic plating.

Other applications of the IBD process of the present invention include the formation of lower and upper magnetic films for a thin-film magnetic head for writing, the formation of a coil, and formation of a TiN barrier layer for interconnections having a barrier layer of a contact hole on a Si substrate for VLSI devices.

DETAILED DESCRIPTION OF THE PREFERRED EMBODIMENTS

EXAMPLE 1

Figure 1:
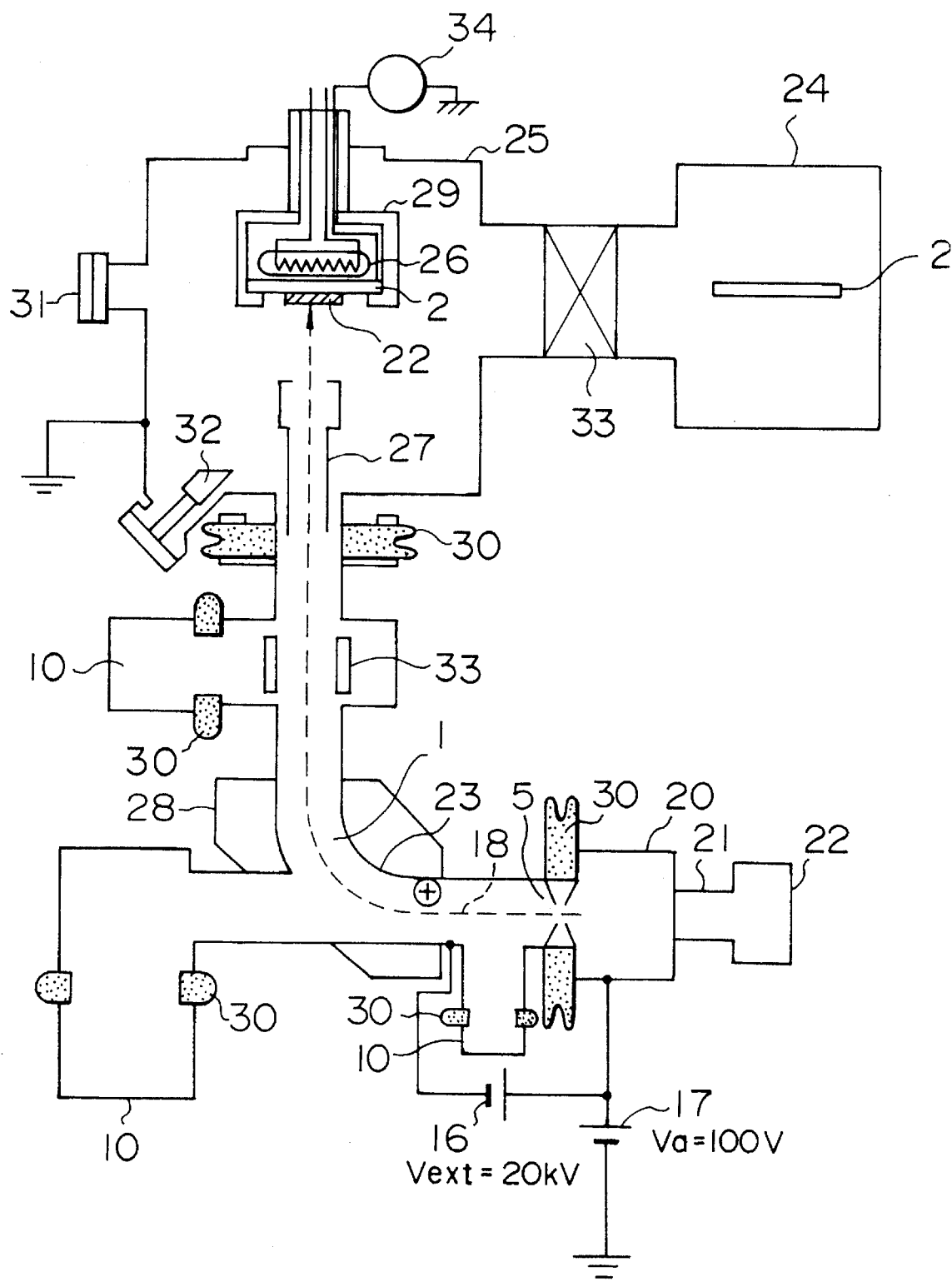
FIG. 1 illustrates an ion beam deposition apparatus according to the present invention.
Figure 2:
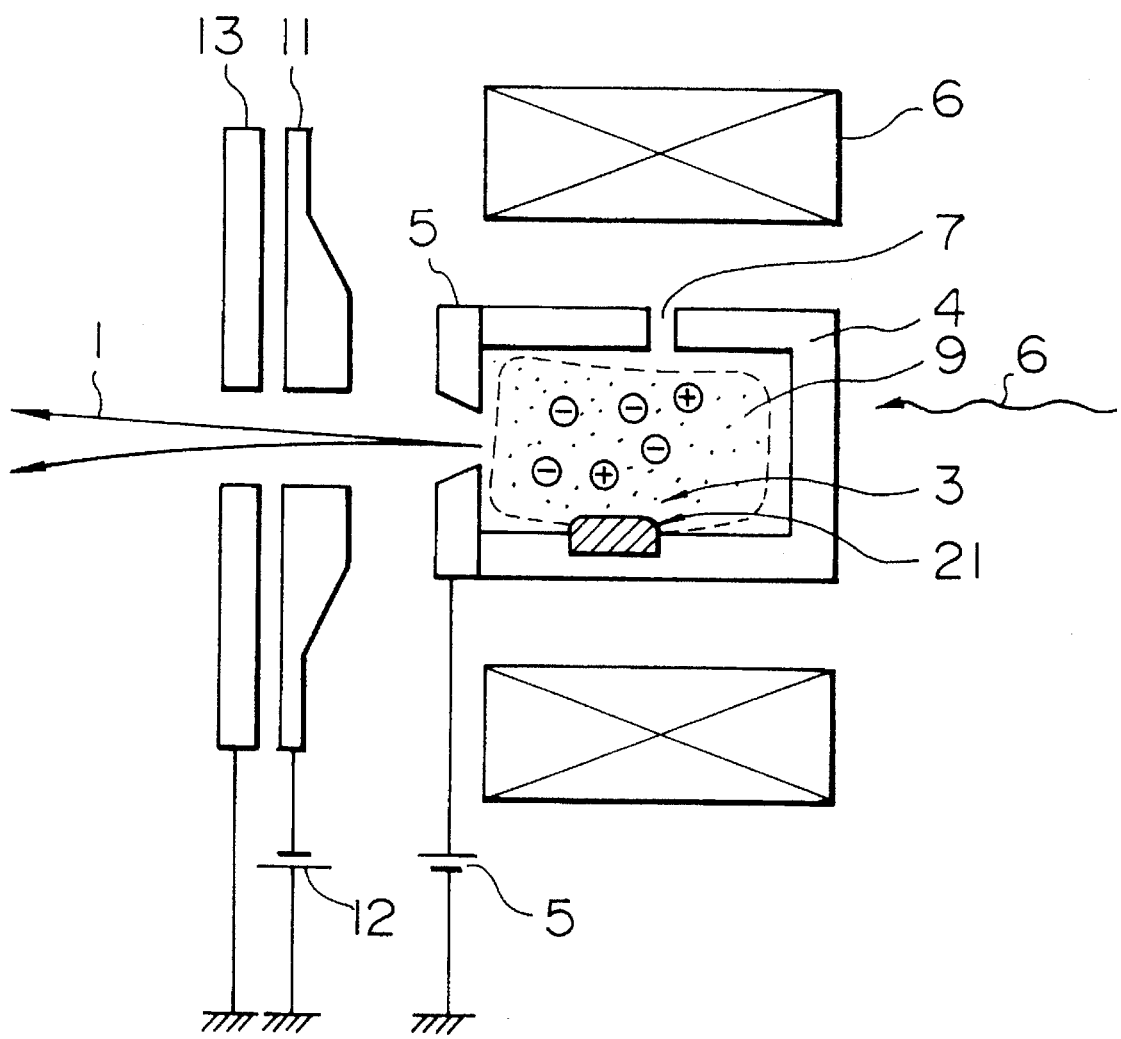
FIG. 2 illustrates an ion source.

FIG. 1 is a schematic view of an ion beam deposition device for generating a metal ion beam. FIG. 2 is a block diagram of a microwave ion source device for generating iron ions by a microwave discharge having a frequency of 2.45 GHz.

In the bottom surface of a discharge chamber 4 made of boron nitride and having dimensions of 20 mm×30 mm×50 mm, a recessed portion 21 having a diameter of 20 mm and a depth of 1 mm is provided. 500 mg of iron oxide (Fe$_2$O$_3$) 3 having an average grain size of 10 μm is placed in this recessed portion 21. A lid 4 made of a conductive material is mounted on one side of the discharge chamber 4. An ion drawing slit 5 whose opening has a size of 2 mm×50 mm is formed in the lid 4. A magnetic field having an intensity of 900 Gaus is applied to the discharge chamber 4 region by means of a magnetic field coil 6, and carbon tetrachloride (CCl$_4$) is introduced into the discharge chamber 4 from a gas introduction port 7 at a rate of 0.5 cc per minute.

A high-density carbon tetrachloride (CCl$_4$) discharge plasma 9 is generated in the discharge chamber 4 by introducing microwaves of 300 W from a magnetron 22 for generating microwaves of 2.45 GHz to the discharge chamber 4 through a wave guide 21. An ion beam 1 is extracted out from the carbon tetrachloride (CCl$_4$) discharge plasma 9 generated in the discharge chamber 4 by respectively applying +30 kV to the electrically conductive slit 5 by means of an ion acceleration power source 5 and −3 kV to a first ion extracting electrode 11 by means of a power source 12 and by grounding a second ion beam extracting electrode 13.

The ions generated by a microwave ion source 20 shown in FIG. 2 were deposited using an ion implanting device, shown in FIG. 1, with the ion source 20 provided therein. The ion implanting device shown in FIG. 1 includes the microwave ion source 20 shown in FIG. 2, the wave guide 21, the magnetron 22, a magnetron power source (not shown), the first ion drawing electrode 11, the extracting power source 12, the second ion extracting electrode 13, an ion beam transporting vacuum pipe 23, a mass separating electromagnet 28 for deflecting the ion beam by 90 degrees, evacuation pumps 10, an ion implanting chamber 25, a substrate 2, a heater 26 for generating the substrate 2, a substrate holding means 29, a substrate load lock chamber 24 for exchanging the substrates 2, a lens system 27, insulators 30, a reflection type high energy electron beam diffraction device 31, an electron gun 32, a valve 33, a collector electrode for measuring an ion current, and an ammeter for measuring an ion current.

The ion beam 1 drawn out from the carbon tetrachloride (CCl$_4$) discharge plasma 9 at an acceleration voltage of 30 kV by operating the microwave ion source under the conditions shown in FIG. 1 was mass separated by scanning the magnetic field intensity of the 90- deflection mass separating electromagnet 28, and the ion current which flows in the ion current measuring collector electrode was measured. It was found that the obtained ion beam was $^{56}$Fe$^+$ ion beam. $^{56}$Fe$^+$ ions are generated by the heating of the ion oxide (Fe$_2$O$_3$) powder 3 placed in the discharge chamber 4 of the ion source with the high-density carbon tetrachloride (CCl$_4$) discharge plasma 9 generated from the CCl$_4$ gas introduced through the gas introduction port 7 and by the plasma chemical reaction of the heated ion oxide (Fe$_2$O$_3$) powder 3 with the CCl$_4$ gas plasma.

In this embodiment, Fe$_2$O$_3$ powder was used to generate iron ions. However, ion oxides, such as Fe$_3$O$_4$ or FeO$_2$, carbides, such as FeC, halides, such as FeCl$_2$, FeCl$_3$, FeCl$_2$.H$_2$O, hydroxides, such as Fe(OH)$_3$, metal nitrides, such as FEN$_4$, organic metal compounds, such as Fe(OCH$_3$)$_3$, metal alloy substances, such as Fe—Zr or FeS$_3$, may also be employed to generate iron ions.

First, an ion beam 18 having a current amount of 5 mA was generated by generating Fe$_2$O$_3$+CCl$_4$ gas discharge in the ion source 20 and then by drawing out the ion beam using a extracting power source 16 at a voltage Vext=20 kV. The generated ion beam was mass separated using the mass separating electromagnet 28 for deflecting the ion beam at an angle of 90 degrees and at a radius of 50 cm to take out Fe ions having a mass number of 56. The potential of the ion source 20 was varied by an acceleration power source 17. The mass separating electromagnet 28 was of saddle type which was divided into three portions along the periphery of the vacuum pipe 23.

The mass separated iron ions were passed through the deceleration lens 27 to decelerate the energy of the ions to the same energy as the acceleration potential in the ion source 20. The decelerated iron ions were introduced into the film forming chamber 25 which was maintained to a degree of vacuum of 2×10$^{-6}$ Pa from a flange 29 having a diameter of 400 mm and mounted at the bottom of the film forming chamber 25.

In the film forming chamber 25, the Si (100) substrate 2 having a diameter of 2 inches was introduced onto the substrate holding mechanism 29 provided with a heating function from the substrate load lock chamber 24 in such a manner that the surface thereof on which a thin film was to be formed was directed downward and that the surface lay in a horizontal direction, as shown in FIG. 1.

A halogen lamp heater 26 which opposed the rear surface of the substrate mounted on the substrate holding mechanism having the heating function 26 was energized to maintain the temperature of the silicon substrate to 300° C.

The mass separated Fe ions were irradiated on the silicon substrate 2 having a diameter of 2 inches and disposed in a horizontal direction from a direction perpendicular thereto for 60 minutes. Consequently, a thin film of pure ions which epitaxially grew in the crystal orientation of (110) could be obtained. The diameter of the film was 20 mm, and the thickness thereof was 500 nm.

In this embodiment, the iron ion energy was between 50 and 500 eV. However, a higher energy can also be used as long as it allows for formation of a thin film by the ion beam deposition process. A lower ion energy assures the formation of a thin film having a fine and smooth surface.

Table 1 lists the iron thin film forming conditions and the corrosion rate calculated from the polarization characteristics obtained by measuring the potential of the ion thin film immersed in a salt water from the cathode to the anode thereof. It is apparent from Table 1 that the corrosion current density, which indicates the corrosion rate, obtained under the conditions of the present invention is one tenth of that obtained under the other conditions or below. The grain size of the films was not greater than 0.2 μm.

Particularly, it was made clear that when the ion energy in the ion beam deposition process was 200 eV or below, a highly corrosion-resistant film could be formed. When deposition was performed with an energy of not less than 1 eV, particularly, not less than 10 eV, which was higher than the ion energy in the evaporation deposition, a highly corrosion-resistant thin film could be obtained.

When the crystal orientation of the surface of each of the iron films was examined with an X-ray diffraction device, it was found that in Example Nos. 7 through 10 of the present invention, shown in Table 1, the (110) plane, which was the close packed surface of a iron, was selectively oriented and was directed in a direction substantially perpendicular to the surface, i.e., that Example Nos. 7 through 10 had a polycrystal structure which was similar to (110) single crystal.

When a distribution of the elements other than iron on the surface of each of the iron films was measured with a glow discharge mass spectrometer, it was found that the amount of elements other than iron in Example Nos. 4 through 10 in Table 1 was one hundredth of that of the elements other than iron in Comparative Example Nos. 1 through 3. Thus, the present invention has the effect of reducing the amount of impurities.

Figure 3:
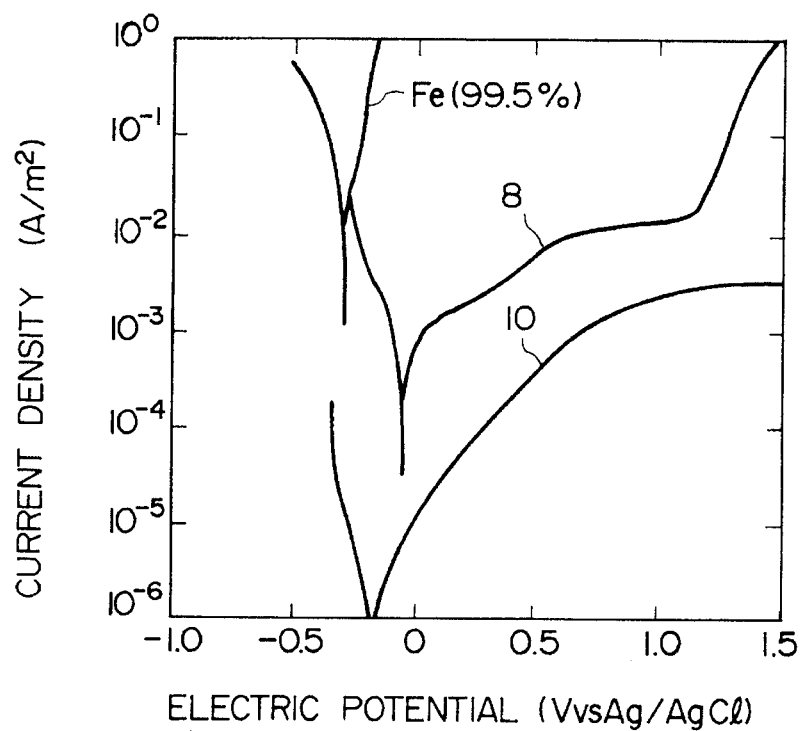
FIG. 3 is a graph showing relationships between current density in NaCl and the potential.

FIG. 3 shows the polarization curves of the iron thin films manufactured according to the present invention and of the iron having a purity of 99.5% which is available on the market. The polarization characteristics were measured by immersing the iron thin films and iron in 0.001M salt water of 25° C. Whereas the corrosion current density of the 99.5% iron which is available on the market is $2\times10^{-2}$ A/m$^2$, the corrosion current density of Sample No. 8 manufactured by the ion beam process according to the present invention with deposition energy of 100 volts was about one tenth of that of the iron which is available on the market, and the corrosion current density of Sample No. 10 manufactured with deposition of 50 volts was about one hundredth of that of the iron which is available on the market. The thin films according to the present invention were made of iron having a purity of no less than 99.999% and mass number of 56.

TABLE 1

| | | No. | Degree of vacuum (Pa) | Substrate temperature (°C.) | Ion acceleration voltage (V) | Corrosion current density (A/m$^2$) |
|---|---|---|---|---|---|---|
| Conventional method | | 1 | $10^{-2}$ | 120 | (Sputtering) | $2 \times 10^{-2}$ |
| | | 2 | $10^{-3}$ | 200 | (Evaporation) | $3 \times 10^{-3}$ |
| | | 3 | — | 80 | (Plating) | $5 \times 10^{-3}$ |
| Invention method | High energy | 4 | $10^{-5}$ | 25 | 250 | $1 \times 10^{-3}$ |
| | | 5 | $10^{-5}$ | 25 | 400 | $3 \times 10^{-3}$ |
| | | 6 | $10^{-5}$ | 25 | 500 | $5 \times 10^{-3}$ |
| | Low energy | 7 | $10^{-4}$ | 25 | 50 | $3 \times 10^{-5}$ |
| | | 8 | $10^{-5}$ | 25 | 100 | $1 \times 10^{-4}$ |
| | | 9 | $10^{-5}$ | 100 | 50 | $4 \times 10^{-5}$ |
| | | 10 | $10^{-5}$ | 25 | 50 | $1 \times 10^{-5}$ |

Figure 4:
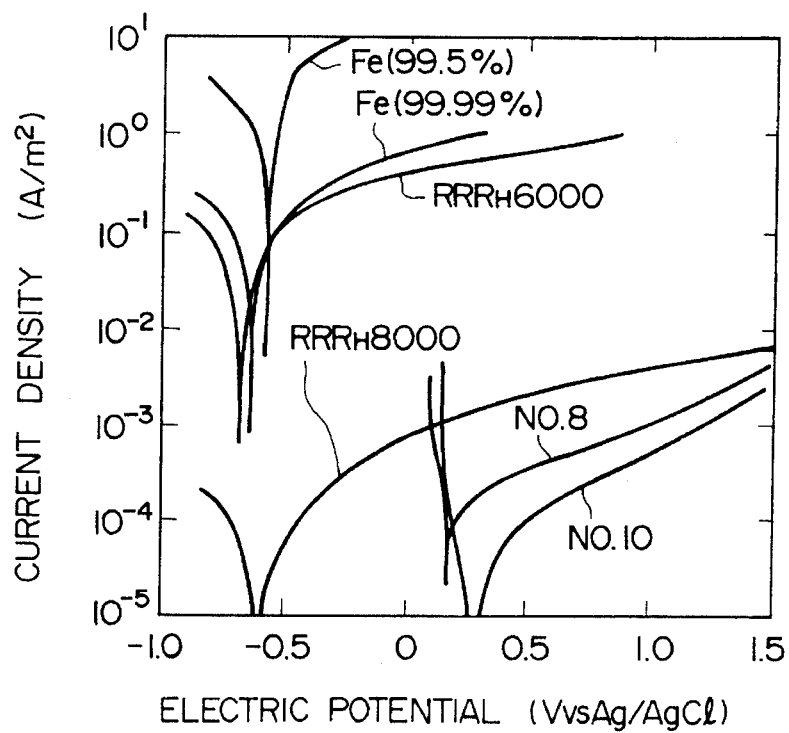
FIG. 4 is a graph showing relationships between current density in $H_2SO_4$ and the potential.

FIG. 4 also shows the polarization curves measured on the samples which were immersed in an 0.001M H$_2$SO$_4$ aqueous solution of 25° C. Fe (99.5%) and Fe (99.99%) indicate irons which are available on the market. RRRH6000 and RRRH8000 correspond to the 99.999% iron and 99.99999% iron obtained by floating zone melting, respectively. It is clear from the figure that corrosion resistance is improved by increasing the iron purity. It is also clear that corrosion resistance is further improved by increasing the iron purity and by forming a surface having a particular plane index, like Sample Nos. 8 and 10.

Figure 5:
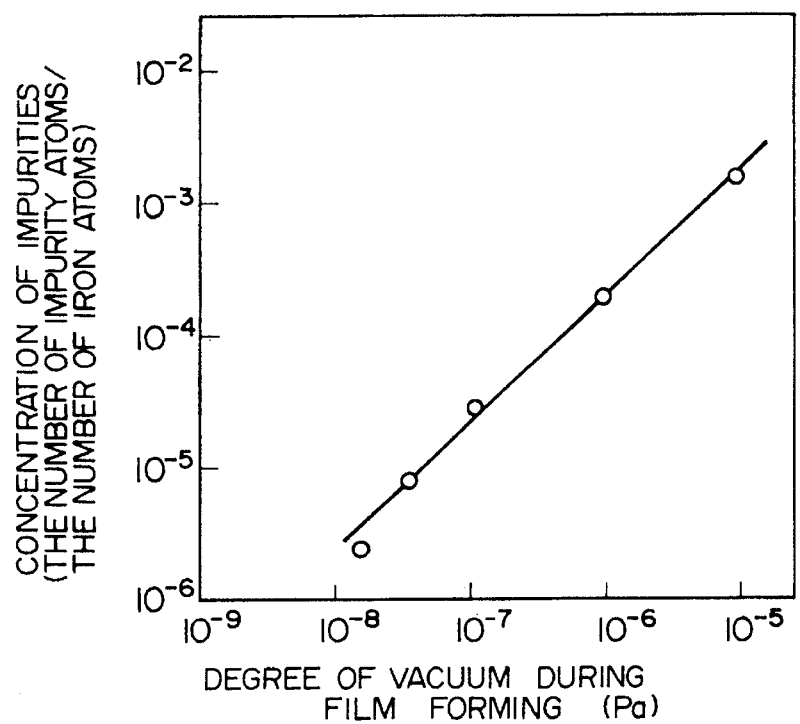
FIG. 5 is a graph showing relationships between the concentration of impurities and the degree of vacuum obtained during film formation.
Figure 6:
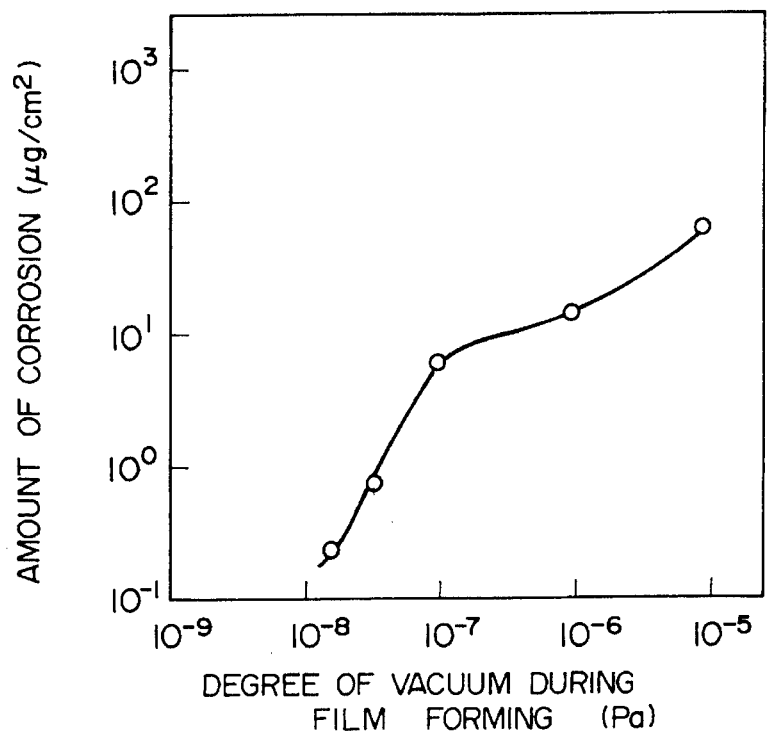
FIG. 6 is a graph showing the amount of corrosion and the degree of vacuum obtained during film formation.
Figure 7:
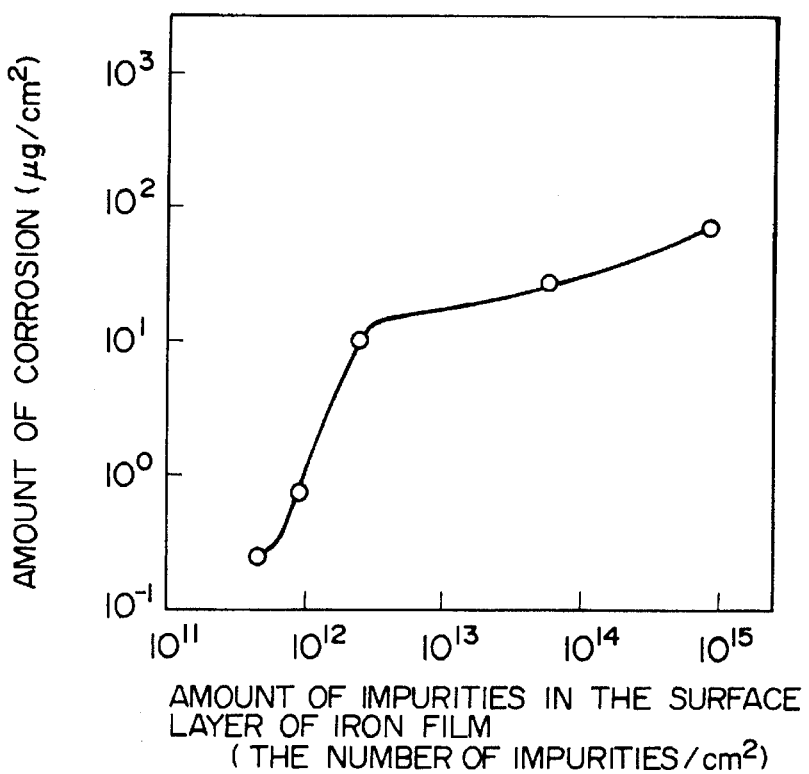
FIG. 7 is a graph showing the amount of corrosion and the amount of impurities on the iron surface.

FIG. 5 is a graphic representation showing the relation between the degree of vacuum achieved during film formation and the concentration of impurities. FIG. 6 shows the relation between the degree of vacuum achieved during film formation and the amount of corrosion measured in salt water. FIG. 7 shows the relation between the concentration of impurities and the amount of corrosion. As shown in FIG. 5, an increase in the degree of vacuum markedly reduces the concentration of impurities, such as oxygen or other metal elements. Particularly, the concentration of impurities is about $1.5\times10^{-3}$ pieces when the degree of vacuum is $10^{-5}$ Pa. As shown in FIG. 6, when the degree of vacuum is $10^{-5}$ Pa, the amount of corrosion is $10^2$ μg/cm$^2$. The amount of impurities when the amount of corrosion is $10^2$ μg/cm$^2$ is about $10^{15}$ pieces/cm$^2$, as shown in FIG. 7. Particularly, when the amount of impurities is $3\times10^{12}$ pieces/cm$^2$ or below, the amount of corrosion rapidly reduces. Thus, a desired degree of vacuum is $10^{-7}$ Pa or above.

Figure 8:
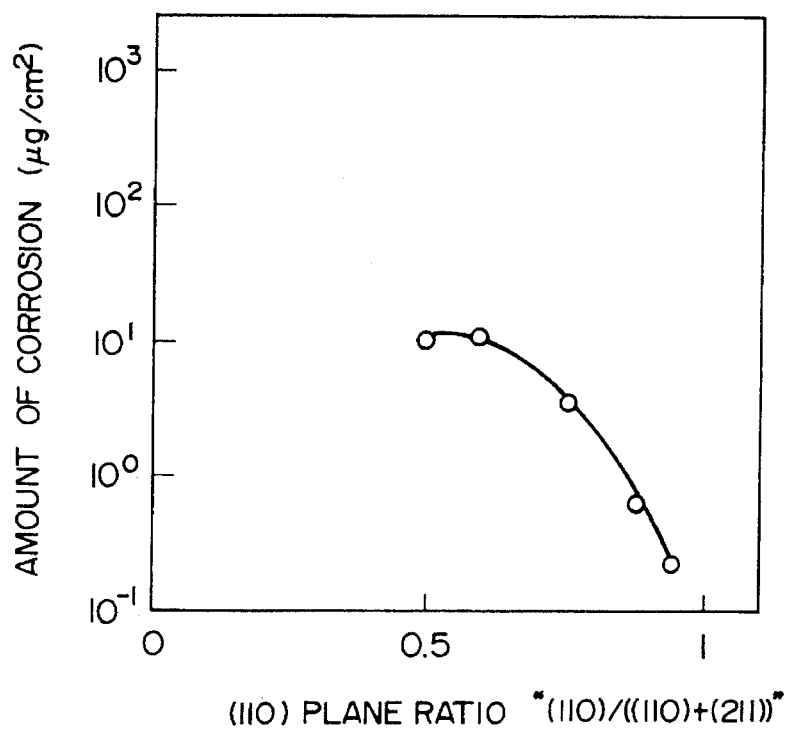
FIG. 8 is a graph showing the amount of corrosion and the plane proportion.

FIG. 8 shows the relation between the proportion of (110) plane in a pure ion and the amount of corrosion in 25° C. salt water of 0.001 mol/liter. The ratio of (110) plane to (211) plane was adjusted by changing the ion acceleration voltage, i.e., the ion energy, in the IBD apparatus according to the first embodiment from 30 eV to 500 eV. As the ion acceleration voltage increases, the proportion of (211) plane increases. Although the selected iron isotope is 56, it has been certified that an increase in the ion acceleration voltage increases the proportion of the crystal orientation other than the close packed surface in other metals, as in the case of ion isotope 56.

Figure 9:
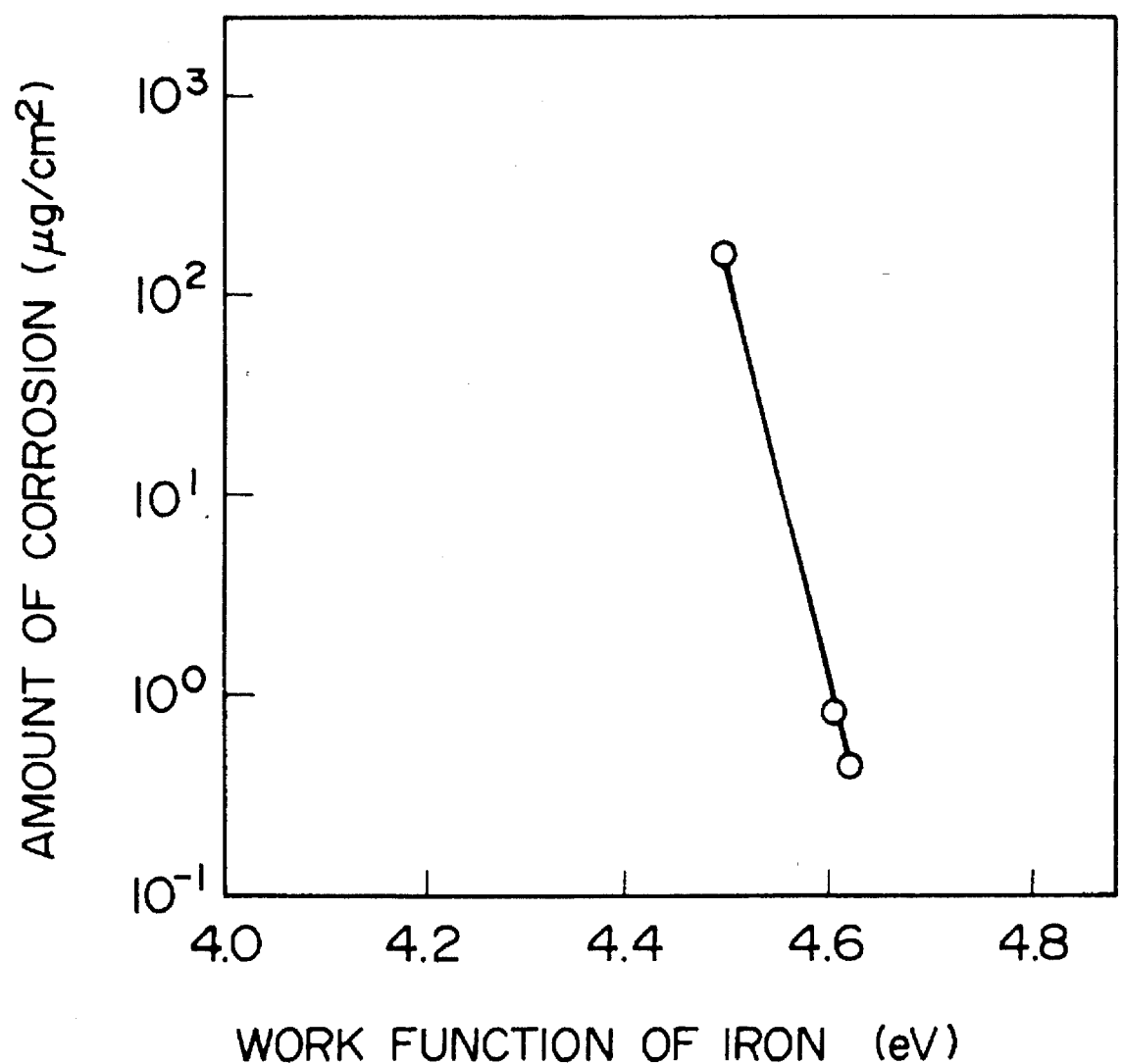
FIG. 9 is a graph showing the amount of corrosion and the work function of iron.

FIG. 9 shows the relation between the measured value of the work function of various irons and the amount of corrosion in 25° C. salt water saturated with air. The work function of the surface of the iron film formed by IBD is 4.65 eV, which is higher than a normal value, 4.5 eV. The threshold value of electron emission from such a surface has correlation with strengthening of the oxide surface film which indicates an improvement of corrosion resistance.

EXAMPLE 2

Thin films of various elements were formed using the ion beam deposition device shown in the first embodiment.

After the metal ions were drawn out from the ion source 20 by means of the acceleration voltage power source 17, they were directed toward the substrate 2 by the magnet 28. Thereafter, the metal ions were condensed onto the substrate which had the same potential as the grounded potential by the lens 27 to deposit a metal on a predetermined area and thereby form a thin metal film. Iron, nickel, manganese, aluminum, copper, tungsten, tantalum, niobium were used to form films. Oxides of such metals were used as the metal compounds which were the materials of plasma for ionizing the metals. The film forming temperature was a room temperature, and the used ion energy was 50 eV. Table 2 shows the proportion of the amount of corrosion measured on the metal films after they were immersed in salt water of 1 mol/liter for 1 hour to the amount of corrosion of the high purity metal which is available on the market. The thin film of any metal formed according to the present invention exhibited high corrosion resistance.

The mass numbers of the metals of the deposited thin films were Fe56, Ni58, Mn55, Al27, Cu63, W184, Ta181, and Nb93, respectively. The same deposition can be performed using the other mass numbers.

TABLE 2

| Type of thin metallic film formed by IBD (name of element) | Proportion of the amount of corrosion in salt water to that of the same metal marketed which is 1 |
| --- | --- |
| Fe | 0.001 |
| Ni | 0.02 |
| Mn | 0.005 |
| Al | 0.07 |
| Cu | 0.2 |
| W | 0.3 |
| Ta | 0.01 |
| Nb | 0.1 |

EXAMPLE 3

Fe and Mo ions were formed using oxides of these metals in the ion source, and Fe56 ions and Mo36 ions were irradiated concurrently to form a highly corrosion-resistant thin Fe—C—Mo low alloy film at a room temperature.

The mass separated ions were supplied upwardly from the bottom of the film forming chamber 25 with an ion energy of 1000 eV for thirty minutes to irradiate the iron substrate 31 having a diameter of 50 mm and disposed horizontally in the film forming chamber 25 evacuated to $2 \times 10^{-3}$ Pa. Fe and Mo were alternately deposited from the evaporation source 3 by switching the current of the electromagnet 28. These metals were alloyed when the formed layer was as thick as a single atom and when the substrate was preheated to about 300° C.

Consequently, a highly corrosion-resistant thin Fe—C—Mo low alloy film 22 could be formed to a thickness of 2 μm on the iron substrate 2 at a substrate temperature which was a room temperature. The corrosion rate of the formed thin film 22 in a saturated salt water was 0.02 mm/year, which was two orders in magnitude smaller than the corrosion rate of a normal thin iron alloy film of 2 mm/year. The thin film was attached to the substrate 2 firmly.

EXAMPLE 4

Figure 10:
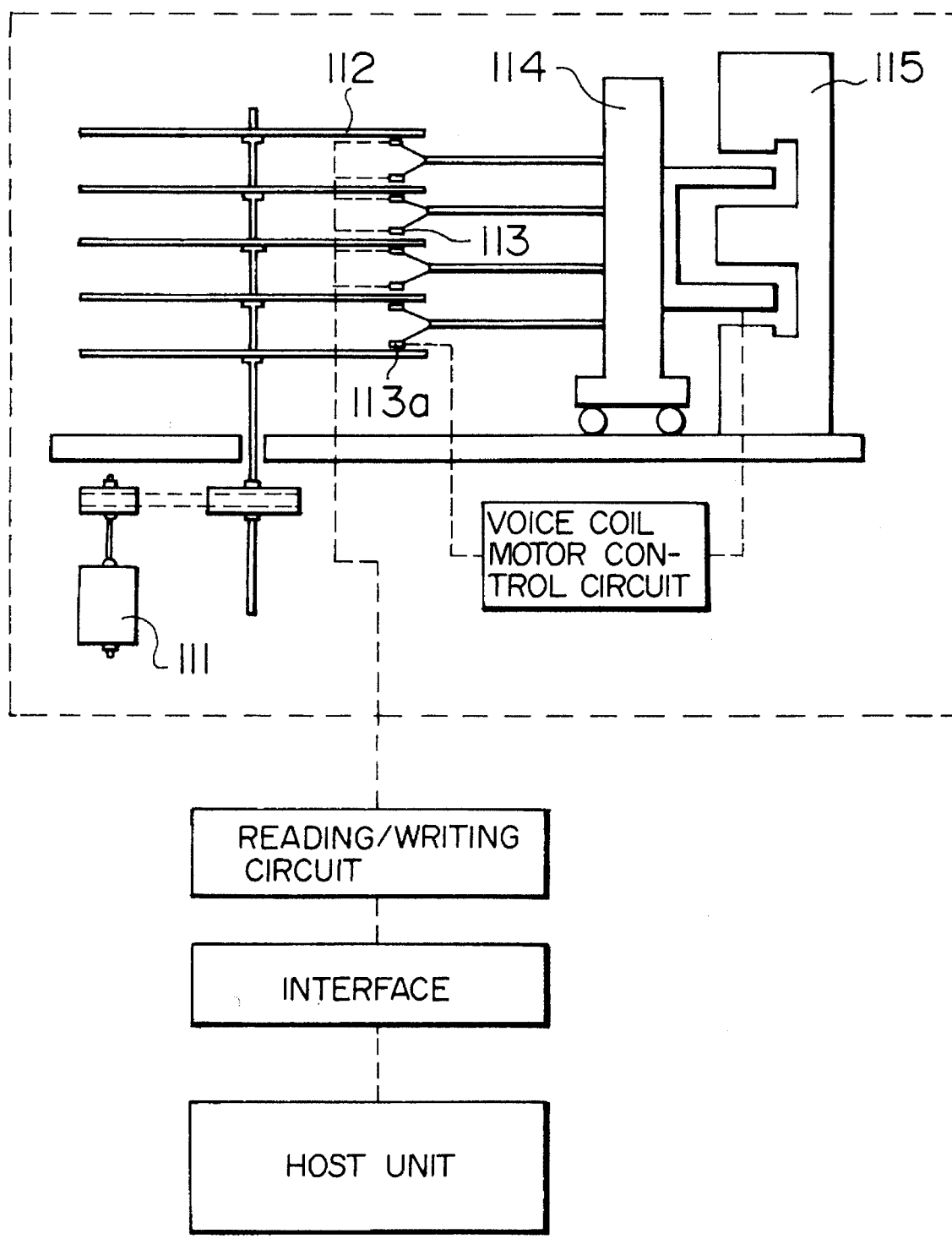
FIG. 10 illustrates a magnetic disk device according to the present invention.

FIG. 10 is a schematic view of a magnetic disk device 4000 according to the present invention. As shown in the figure, the magnetic disk device 4000 includes a plurality of magnetic disks 112 which are piled on top of one another along a single axis (a spindle) at equal intervals, a motor 111 for driving the spindle, a magnetic head group 123 held on a movable carriage 114, a voice coil motor 115 for driving the carriage 114, and a base for supporting these components. The magnetic disk device 4000 further includes a voice coil motor control circuit for controlling the voice coil motor 115 according to the signals sent from an upper apparatus, such as a magnetic disk control apparatus, and a read-write circuit having the function of converting the data sent from the upper apparatus into a current which is to be supplied to the magnetic head according to the write system and the function of amplifying the data sent from the magnetic disk 113 and of converting the amplified data into a digital signal. This read/write circuit is connected to the upper apparatus through an interface.

The reading operation of the magnetic disk device 4000 will now be described in detail. The upper apparatus gives an instruction on the data to be read out to the voice coil motor control circuit. The voice coil motor 115 drives the carriage 114 by the control current from the voice coil motor control circuit to move the magnetic head group 113 to the position of the track on which the designated data is stored at a high speed and accurately locate the magnetic head group 113 at that position. To perform this positioning of the magnetic heads 113, positioning magnetic heads 113a connected to the voice coil motor control circuit detect the position on the magnetic disks 112. Further, the motor 111 supported on the base rotates the plurality of magnetic disks 112 mounted on the spindle. Next, the designated magnetic head is selected according to the signal from the write/read circuit. After the starting position of the designated area is detected, the data signal on the magnetic disk is read out. To perform this reading, the magnetic head 113 connected to the write/read circuit exchanges data with the magnetic disk 112. The read out data is converted into a predetermined signal. The converted signal is sent to the upper apparatus.

The track density of the magnetic disk according to the present invention is from 2600 to 20000 tracks per inch. The linear recording density thereof is from 65 to 200 kiro-bits per inch. The area recording density determined by the product of the track density and the linear recording density is from 170 to 4000 mega bits per square inch.

Figure 16:
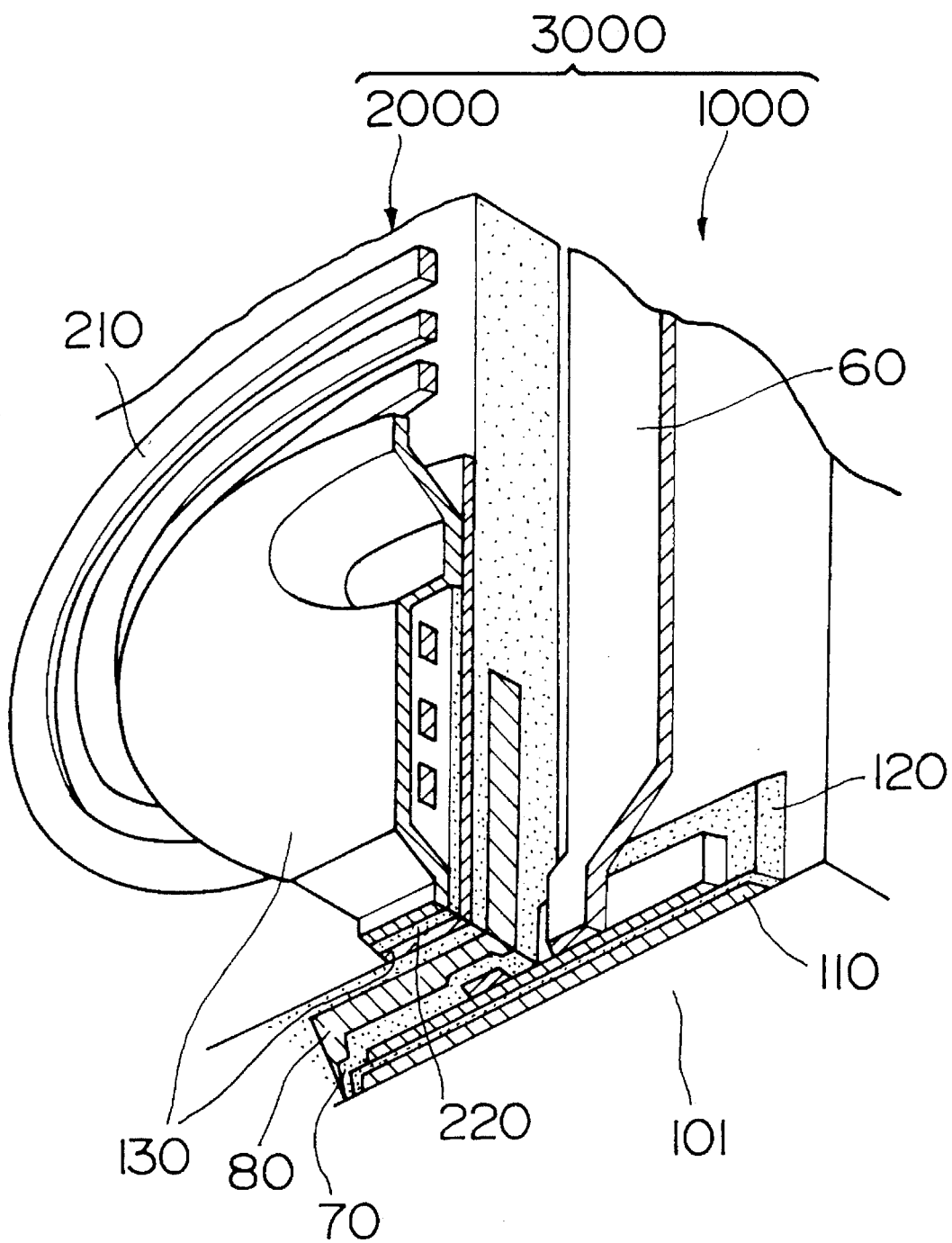
FIG. 16 is a perspective view, partially in cross-section, of a recording reproduction separation head.

The magnetic head mounted on the magnetic disk device according to the present invention may be a recording reproduction separation type head 3000 shown in FIG. 16. The recording reproduction separation type magnetic head 3000 is made up of an electromagnetic induction type thin film read magnetic head 2000 and a magnetoresistive read magnetic head (hereinafter referred to as an MR head) 1000.

In the MR head 1000, the reproduction output per track is 5 to 10 times that of a conventional electromagnetic induction type thin film read/write magnetic head when the amount of floating and the type of magnetic disk medium in the reproduction operation are the same. Furthermore, the reproduction output of the MR head 1000 is not affected by the peripheral speed of the magnetic disk.

Therefore, even when the track width of the MR head is reduced, i.e., even when the track density of the magnetic disk medium is increased, a high reproduction output can be obtained. Further, even when the linear recording density of the magnetic disk medium is increased, a high reproduction output can be obtained.

In the present invention, since the Barkhausen noise which is readily generated in an electrical signal from the magnetic disk during reproduction is restricted and since the base line variations of the reproduced waveform generated due to that noise can be restricted to 3% or below at any disk rotational speed, any sensing current and any amount of floating, a noiseless electrical signal can be obtained, and a high S/N ratio can be assured. These allow for the reproduction of data at a high sensitivity.

Furthermore, it is possible according to the present invention to obtain a stable, high output and noiseless electrical signal within the operation temperature range.

Furthermore, since the recording head and reproduction head are provided separately in the present invention, a magnetic core 130 of the recording head 2000 can be made of a material having a high saturated magnetic flux density Bs. As a result, the writing magnetic field can be intensified and made sharp, and recording at a high linear recording density is thus enabled. Further, even when the track width is narrowed, a high writing magnetic field can be maintained, making recording at a high track density possible. These enable the coercive force of the magnetic disk medium to be increased.

Therefore, in a magnetic disk device which incorporates the MR head 1000 according to the present invention, high output and noiseless reproduction are achieved regardless of the size of the disk.

Therefore, high density recording is enabled regardless of the size of the magnetic disk. Even when the disk diameter is reduced to from 1.5 inches to 6.5 inches, recording and reproduction can be performed at a magnetic disk rotational speed of 3500 to 5000 rpm, at a track density of 2.6 to 20.0 ktpi and a linear recording density of 60 to 200 ktpi in the magnetic disk device according to the present invention, and an area recording density of 170 to 400 mega bits per square inch can thus be achieved.

Furthermore, even when the bit density and track density are increased in order to satisfy the capacity required for a small magnetic disk device and the disk diameter is reduced to 1.5 to 3.0 inches, reading and writing can be performed sufficiently. Therefore, the disk size can be reduced to the above-mentioned value, and a small magnetic disk device having a large capacity can be provided.

A magnetic disk device which assures an increase in the recording density and data storage capacity but permits reduction in the data transfer speed is useless. The higher the linear recording density, the higher the data transfer speed. In this invention, a linear recording density from 60 to 200 k bits per inch can be obtained, and a high transfer speed can thus be obtained.

Furthermore, since the magnetic core 130 of the recording head 2000 can be made of a material having a high Bs in the present invention, a sufficiently high writing magnetic field can be maintained even when the number of turns of a conductive coil 110 is reduced. As a result, the number of turns can be reduced (FIG. 16), thus reducing the inductance of the recording head 2000 and making the data writing operation at a high frequency possible.

The reproduction output of the MR head is not affected by the peripheral speed, and the data reading operation at a high frequency can be performed.

The electrical signal obtained using the MR head 1000 according to the present invention is noiseless. Therefore, it is not necessary for the obtained electrical signal to be passed through a special circuit for processing the Barkhausen noise in order to convert it into a digital signal.

Thus, it is possible according to the present invention to obtain a data transfer speed from 6 to 9 mega bytes/sec.

When the data transfer speed increases, the data access time (the time required for positioning) must be reduced. In the present invention, a desired data access time is from 5 to 10 milli-seconds.

A desired disk rotational speed is 3500 rpm or above, and a desired average rotation waiting time of the magnetic head is 6 m second or below in terms of the data transfer speed. Here, the rotation waiting time is the time during which the magnetic head, which has moved to a predetermined track position, is kept waiting for the magnetic disk to be rotated in order to write data to a predetermined position on that track or to read out data from a predetermined position.

In the present invention, since the diameter of the magnetic disk can be reduced, a high-speed seek can be achieved. Further, since the Barkhausen noise of the MR head 1000 can be restricted, the access time can be reduced.

If Barkhausen noise (base line variations) is generated during the signal reading operation from the magnetic disk by the MR head, the MR head must read out the data signal from the magnetic disk again. At that time, the reading operation is performed in the above-mentioned cycle again. In, for example, a magnetic disk device which incorporates an MR head for generating Barkhausen noise at a possibility of 50%, the access time is delayed by $\frac{1}{30}$ second. In the magnetic disk device according to the present invention, since Barkhausen noise of the MR head can be restricted, the access time can be reduced to 5 to 10 milli seconds.

Figure 13:
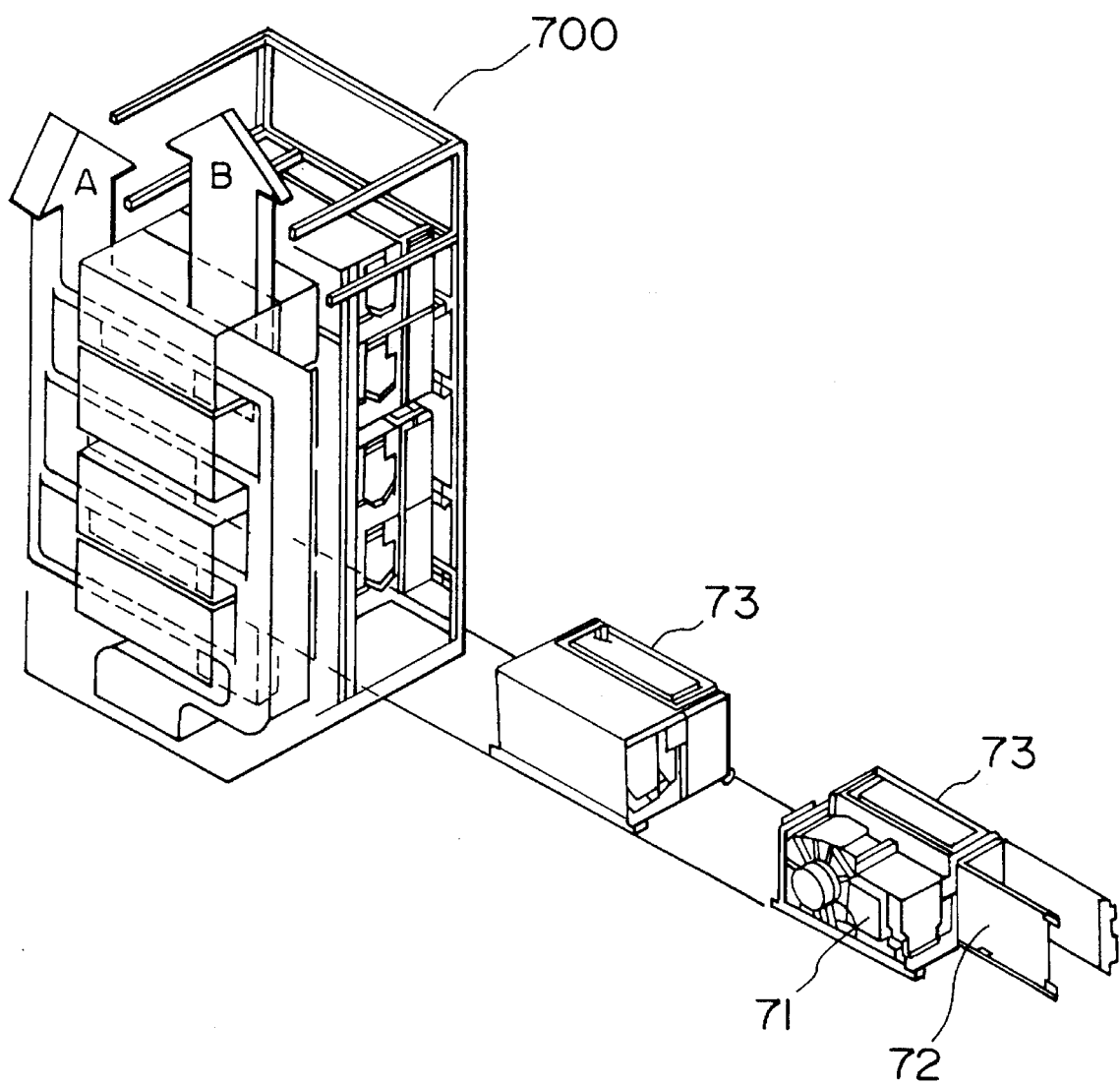
FIG. 13 is a perspective view showing the overall structure of the magnetic disk device.

FIG. 13 is a perspective view showing how the magnetic disk device according to the present invention is accommodated in a predetermined space.

A head/disk assembly unit (HDU) 73, which is made up of a head/disk assembly (HDA) 71 and an electronic circuit portion 72, is accommodated in a vessel 700. In the vessel 700, the length of one side of the bottom thereof is between 0.3 and 1.5 m, and the height of the vessel 700 varies from 0.2 to 2 m according to the capacity of the device. In FIG. 13, A and B indicate passages of air through which clean air is supplied to the circuit boards in the HDA and HDU.

Figure 14:
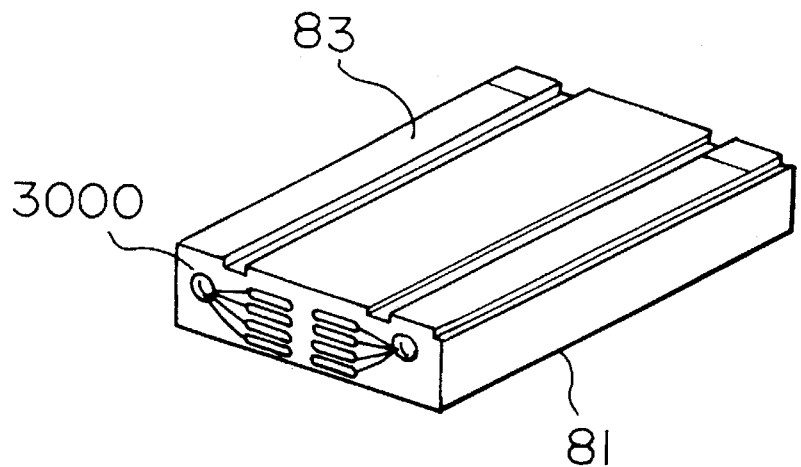
FIG. 14 is a perspective view of a slider on which the magnetic head is formed.

FIG. 14 is a perspective view showing how the recording reproduction separation type magnetic head according to the present invention is formed on a predetermined slider. Reference numeral 81 denotes a slider made of, for example a non-magnetic ceramic. Reference numeral 3000 denotes a recording reproduction separation type magnetic head having a configuration shown in FIG. 16. There are four current terminals for the recording reproduction separation type magnetic head because the recording head and the reproduction head are provided separately. Reference numeral 83 denotes a medium opposing surface which opposes the magnetic disk.

Figure 15:
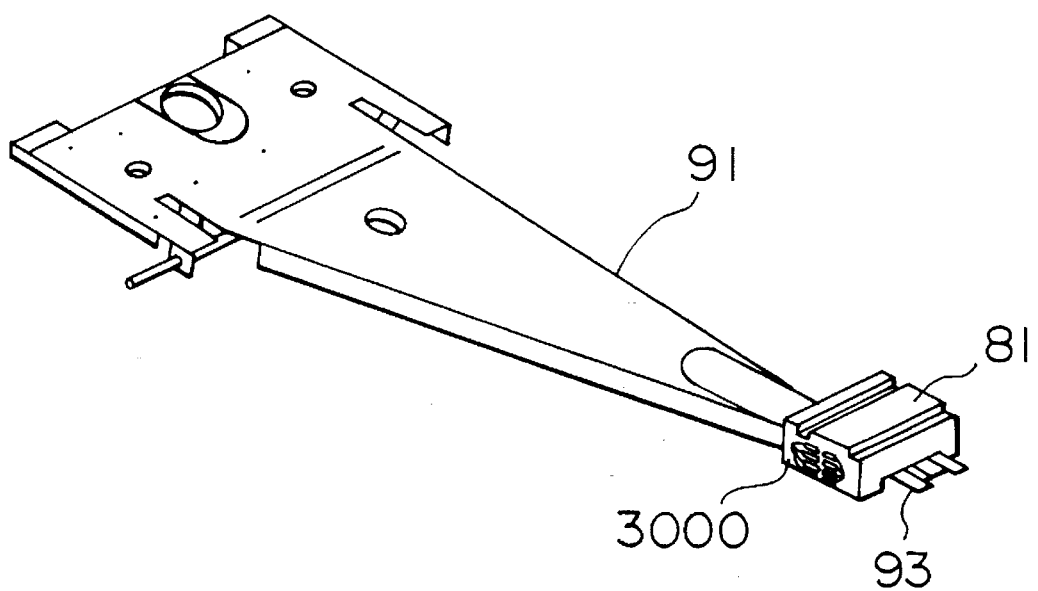
FIG. 15 is a perspective view of the slider and a load arm.

FIG. 15 is a perspective view showing how the slider shown in FIG. 14 is formed on a load arm.

Reference numeral 91 denotes a load arm for supporting the slider 81. Reference numeral 93 denotes a gimbal spring for maintaining the distance between the slider and the magnetic disk to a fixed value. The distance between the magnetic disk and the recording reproduction separation type magnetic head 3000 formed on the distal end of the slider 81 in a magnetic disk device activated state is generally called an amount of floating, and is one of the important factors of the performance of the magnetic disk device. In the magnetic disk device according to the present invention, this amount of floating can be reduced to 0.2 μm or below.

FIG. 16 shows the recording reproduction separation head 3000 mounted on the magnetic disk device according to the present invention. The MR head 1000 used only for reproduction is formed on a non-magnetic ceramic substrate 101, and the electromagnetic induction type recording head 2000 used only for recording is formed above the MR head 1000. In FIG. 16, the right half of the recording head 2000 and the right half of the MR head 2000, respective layers formed above a signal detection electrode 60, are omitted.

In FIG. 16, reference numeral 210 denotes a conductor coil. Reference numeral 130 denotes upper and lower magnetic cores. An insulator film, designated by 220, is formed between the upper and lower magnetic cores to provide an electrical insulation.

In the recording reproduction separation type magnetic head 3000 according to the present invention, since the recording head 2000 does not perform the reading operation, a high magnetic permeability and low magnetostrictive characteristics, which would be required for reading, are not required for the magnetic cores 130, and high Bs characteristics alone, which would be required for writing, are required. Thus, the material having a high Bs can be used to form the upper and lower magnetic cores 130, as mentioned above. Furthermore, since the writing characteristics are not substantially affected by the magnetostrictive constant of the magnetic cores 130, the selection range of the material and the margin of the material composition can be expanded, facilitating the manufacture of the recording head 2000. Consequently, throughput and yield can be improved. Furthermore, an element used to improve corrosion resistance, such as Cr, can be added, and a recording head 2000 exhibiting excellent corrosion resistance can thus be manufactured.

Figure 11:
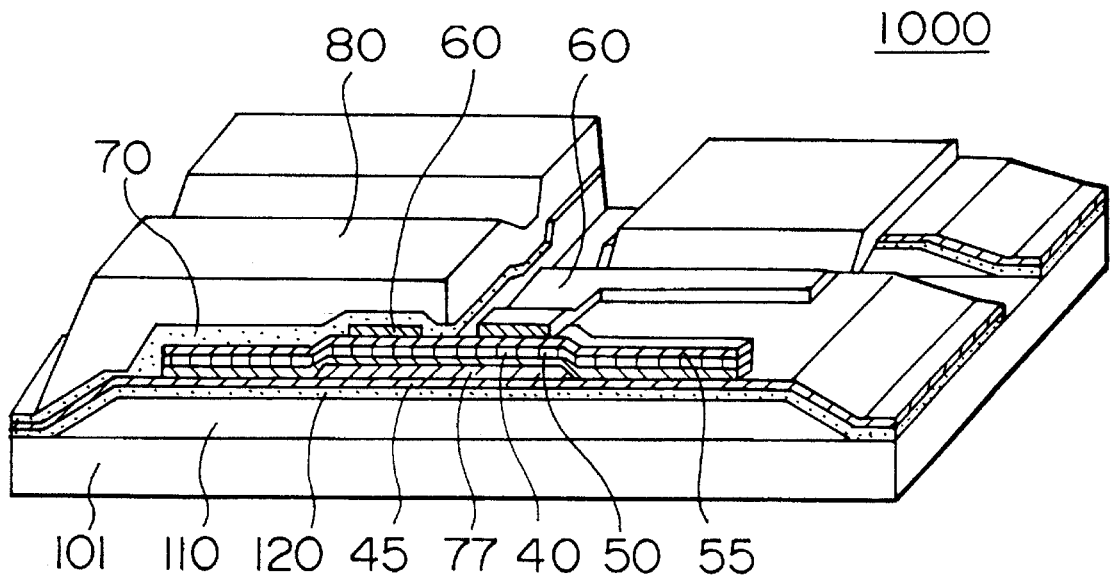
FIG. 11 is a cross-sectional view of a magnetoresistive effect type magnetic head.
Figure 12:
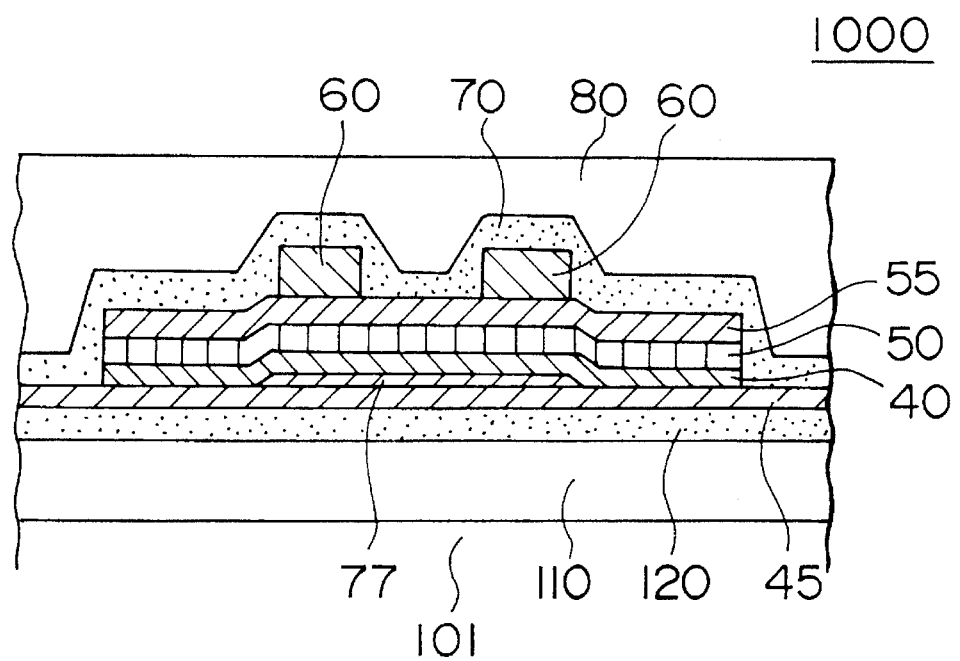
FIG. 12 is an enlarged view of the essential parts of FIG. 11.

FIG. 11 is a perspective view showing a typical magnetoresistant effect type magnetic head according to the present invention which is the most suitable embodiment to solve the above-described problems. FIG. 12 is an enlarged cross-sectional view as seen when looking from the direction of the surface which opposes a magnetic recording medium.

The magnetoresistant effect type head 1000 shown in FIG. 11 includes a lower shield film 110 formed on a ceramic substrate 101 made of, for example zirconia, a lower alumina gap film 120 formed on the lower shield film 110, an oxide antiferromagnetic film 45 of, for example, a Fe—Mn alloy or NiO formed on the lower gap film 120, a separation film 77 made of, for example, alumina and disposed on the oxide antiferromagnetic film 45 at least at a magnetic field sensing portion of a magnetoresistant effect film 40, the magnetoresistant effect film 40 formed on the separation film 77 in such a manner that it covers a predetermined area of the oxide antiferromagnetic film 45 on which the separation film 77 is not disposed, a shunt film 50 of, for example, Nb and a soft film 55 of, for example, a Ni—Fe alloy which are formed on the magnetoresistant effect film 40, a signal detection electrode 60 of, for example, Nb formed on the soft film 55, an upper gap film 70 formed on the above-described respective films, and an upper shield film 80 formed on the upper gap film 70. The feature of the present invention resides in the structure of a domain control layer for preventing noise called Barkhausen noise, the magnetoresistant effect film and the electrode film.

The operation and material of the respective layers and films will be described below.

The upper and lower shield films 80 and 110 have the function of preventing a magnetic field other than the signal affecting the magnetoresistant effect type film 40 and of increasing the signal resolution of the magnetoresistant effect type head 1000, and are made of a soft magnetic alloy, such as an NiFe alloy, an NiCo alloy or a Co type amorphous alloy. A preferred thickness thereof is between 0.5 and 3 μm.

The upper and lower gap films 70 and 120 disposed adjacent to the upper and lower magnetic shield films 80 and 110 have the function of electrically and magnetically separating a magnetoresistant effect element from the upper and lower shield films 80 and 110, and are preferably made of a non-magnetic and insulating material, such as silicon oxide, glass or alumina. The thickness of the upper and lower gap films 70 and 120 affects the reproduction resolution of the magnetoresistant effect type head 1000, and thus depends on the recording density desired for the magnetic disk device. A preferable thickness is between 0.4 and 0.1 μm. A preferable distance between the pair of signal detection electrodes 60 is between 0.5 and 10 μm. In the magnetic head mounted on the magnetic disk device according to the present invention, the reproduction track width can be narrowed to, for example, 0.5 to 2 μm. The portion of the magnetoresistant effect film 40 located between the signal detection electrodes 60 is called a magnetic field sensing portion, and contributes to the reading of the signal from a magnetic disk. In order to apply a transverse bias to the magnetoresistant effect film 40 to convert the magnetic signal from the magnetic disk into a linear electrical signal, the shunt film 50 and the soft film 55 are provided. The magnetoresistant effect film 40 is formed of a ferromagnetic substance whose electrical resistance changes according to the direction of magnetization, such as an NiFe alloy containing 10 to 20 wt % of Ni, an NiCo alloy, an NiFeCo alloy or any of these alloys which contains no more than 3 wt % of Ru, by the ion deposition process according to the present invention. A desired thickness thereof is between 0.001 μm and 0.045 μm. The deposited surface thereof is (100) surface. The shunt film 50 and the soft film 55 have fine crystal grains having a grain size of 5 nm or below. A desired length of the portion where the domain control film 45 is in direct contact with the magnetoresistant effect film 40 is not less than 3 μm in the longitudinal direction of the magnetoresistant effect film. In this way, no domain wall is generated in that portion, and the oxide antiferromagnetic film 45 can thus function as the domain control film.

In order to supply sufficient current, e.g., $1 \times 10^6$ to $2 \times 10^7$ $A/cm^2$, to the magnetoresistant effect film 40, the signal detection electrodes 60 are made of a material having a low electrical resistance, such as Cu, Au, Nb or Ta.

The shunt film 50 applies a transverse bias of a level sufficient to improve the sensitivity of the film 40 to the magnetoresistant effect film 40. The direction of application of this bias field is perpendicular to the direction of application of a bias by the domain control film. The method of applying a transverse bias using a shunt film is referred to as shunt biasing. In shunt biasing, a thin metal film, such as Ti, Nb, Ta, Mo or W, is formed, as the shunt film, on the magnetoresistant effect film 40. The thickness of the shunt film is between 0.01 and 0.04 μm. Furthermore, since the transverse bias field varies according to the current which flows in the shunt film, both the thickness and a specific resistance of the shunt film 50 must be adjusted. A desired specific resistance is 1 to 4 times that of the magnetoresistant effect film 40.

The other method of applying, to the magnetoresistant effect film 40, a transverse bias of a level sufficient to improve the sensitivity of the film 40 and make the film suitable for use in a magnetoresistant effect type head for high-density magnetic recording is soft-film biasing.

In soft-film biasing, a ferromagnetic film having soft magnetic characteristics is formed adjacent to the magnetoresistant effect film with a non-magnetic layer therebetween in order to efficiently apply a magnetic field generated by the current which flows in the magnetoresistant effect film to the magnetoresistant effect film. The soft film 55 is made of NiFeRu, NiFeTa, NiFeRh, CoZrCr or MnZn ferrite.

Although it is possible to employ either of these biasing methods, the use of composite biasing achieved by forming the soft film 55 on the shunt film 50 (non-magnetic film), as shown in FIG. 11, is effective. The magnetoresistant effect type head 1000 according to the present invention has employed composite biasing.

The method of manufacturing the magnetoresistant effect type head 1000 will now be described. In this method, thin film formation and patterning are conducted using the sputtering, etching and photo-lithographic processes.

First, an NiFe alloy is deposited to a thickness of 2 μm to form the lower shield film 110, and then alumina is disposed to a thickness of 0.3 μm to form the lower gap film 120. Thereafter, the lower shield film 110 and the lower gap film 120 are shaped in a predetermined form. At that time, the end portion of the lower shield film 110 is inclined with respect to the substrate surface, as shown in FIG. 11, in order to prevent breakage of the signal detection electrodes 60 formed in such a manner that they cover the lower magnetic shield film 110 at the end portion of the lower shield film 110. Next, the oxide antiferromagnetic film 45 is formed to a thickness of 0.04 to 0.2 μm on the lower gap film 120, and then the separation film 77 is formed to a thickness of 0.01 to 0.02 μm at a predetermined position. At that time, the separation film 77 is formed by the lift-off method so that it can be disposed at the position of the magnetic field sensing portion of the magnetoresistant effect film 40. The two end portions of the separation film 77 may be tapered in order to prevent stepping of the magnetoresistant effect film 40. Further, the separation film 77 may also be formed by ion milling. Next, an NiFe alloy film is formed to a thickness of 400 Å on the separation film 77 as the magnetoresistant effect film 40. Subsequently, an Nb film is formed to a thickness of 400 Å as the shunt film 40, and then a CoZrNb film is formed to a thickness of 400 Å as the soft film 55. Thereafter, the soft film 55, the shunt film 50, the magnetoresistant effect film 40 and the separation film 77 are shaped concurrently such that they have forms shown in FIG. 1 by, for example, ion milling. After a double-layer film of gold and titanium is formed to a thickness of 0.1 μm as the signal detection electrodes 60 and processed, alumina is deposited to a thickness of 0.3 μm on the double-layer film as the upper gap film 70. Next, an NiFe alloy film is formed to a thickness of 2 μm as the magnetic shield film 80, and then alumina is formed as a protective film, thereby completing manufacturing of the magnetoresistant effect type head 1000.

In the magnetoresistant effect type magnetic head according to the present invention, the sensitivity is improved without the magnitude of magnetic exchange coupling being reduced. The end portions of the magnetoresistant effect film can function as the domain control layers without the magnetoresistant effect film being cleaned, which can cause variations in the characteristics or noise. In the method of manufacturing a magnetoresistant effect type magnetic head according to the present invention, variations in the performance of the plurality of magnetoresistant effect type magnetic heads, caused by variations in the characteristics of the domain control layers, can be suppressed. In other words, in the magnetoresistant effect type magnetic head according to the present invention, the magnetoresistant effect film has the function of the domain control layer and at the same time has the portion where the direction of magnetization changes freely. These can be achieved by shaping the separation film 77 in a desired form. When the electrodes are formed within the area where the direction of magnetization changes freely, the portion between the electrodes can be made the reproduction track width, thus preventing generation of Barkhausen noise. Further, the track width can be narrowed only by narrowing the portion between the electrodes. Furthermore, the sensitivity of the portion between the electrodes becomes substantially uniform, and the reproduction sensitivity is thus greatly improved.

In order to increase the portion of the detection current which flows into the magnetoresistant effect film, an oxide film is used as the domain control layer 45. Examples of the oxide films having the domain control effect include ferromagnetic films or antiferromagnetic films. However, antiferromagnetic nickel oxide (NiO) is preferable from the viewpoints of stability to an external magnetic field, the blocking temperature and the ease of manufacture. In addition to NiO, hematite (which may be substituted for α-$Fe_2O_3$) or NiO which contains a magnetic element, such as Fe, Co or Ni, or a rare earth type magnetic element, such as La, Ce, Pr, Nd, Pm, Sm, Gd, Tb, Dy, Ho, Er, Tm or Yb, can also be employed as the material of the oxide antiferromagnetic film 45.

Suitable examples of the material of the separation film 77 include Al, Ti, Cu, Nb, Mo, Ta, W, Ti, V, Cr, Rh, Ru, Zr, Pd, Ag, Pt, In, Sn, Re, Os, Ir, Au, alumina ($Al_2O_3$), silicon oxide ($SiO_2$), titania ($TiO_2$), hafnia ($HfO_2$), zirconia ($ZrO_2$) and carbon (C). The separation film 77 may also be a non-magnetic alloy film composed of a combination of at least two of the above-described metal elements. It may also be made of a material composed of an oxide, carbon and a third element. $Al_2O_3$, $SiO_2$, $TiO_2$, $HfO_2$ and $ZrO_2$ provide insulation. Therefore, when the separation film 77 is made of any of these substances, the current density which flows in the magnetoresistant effect film 40 can be increased, and the sensitivity of the magnetoresistant effect type magnetic head can be improved.

The thickness of the separation film 77 is between 10 and 300—As shown in FIG. 11, the magnetoresistant effect film 40 is formed on the separation film 77. Since the magnetoresistant effect film 40 is formed in such a manner that it covers the separation film 77, if the thickness of the separation film 77 is large, the magnetoresistant effect film 40 may be stepped. Therefore, a thin separation film is desired, and a desirable thickness is 200 Å or below. The critical film thickness of the separation film formed as a continuous film by, for example, sputtering is not less than 50 Å. Therefore, the preferable thickness of the separation film 77 is between 50 and 200 Å. In order to effectively apply a bias from the end portion, it is preferred that the thickness of the magnetoresistant effect film 40 be larger than that of the separation film.

Although the MR head provided with the shield films has been described, the present invention can also be applied to a non-shield magnetoresistant effect type magnetic head, a yoke magnetoresistant effect type magnetic head, a magnetoresistant effect type magnetic head for magnetic tapes or a magnetic sensor which utilizes the magnetoresistant effect of a ferromagnetic film.

In this embodiment, the shield films 110 and 80 which constitute the magnetoresistant effect type thin-film magnetic head media opposing surfaces are made of an iron nickel alloy. The antiferromagnetic film 45 is made of an iron manganium alloy. The magnetoresistant effect film 40 is made of an iron nickel Permalloy which contains 1 wt % of Ru. The separation film 77 is made of an oxide film of Al. The shunt film 50 is made of Nb. The soft film 55 is made of an Ni—Fe alloy which contains 1 wt % of Ru. The electrodes 60 are made of Nb. The respective films are formed by IBD. The respective films are patterned using photoresists. The thickness of each of the films is converted from the ion beam current. Each of the thin metallic films is formed to a desired thickness ranging from 10 to 3000 nm. In IBD, after the metal element has been positively ionized, metal ions are taken into the vacuum vessel by accelerating them with a negative electric field. After the isotope ions having the same mass number are selected by the mass separation magnet, the ion energy is decelerated to 200 eV or below to deposit the metal ions having the same mass number.

The film formation by IBD in this embodiment was conducted using the apparatus shown in FIG. 1. Oxides of various elements were used as the ion sources. The degree of vacuum was $10^{-5}$ Pa. The acceleration voltage of the ion source was 50 volts. The temperature of the substrate was 300° C. The mass numbers of the elements are the same as those shown in the second embodiment. A thin alloy film was formed by alternately depositing metals in layers each of which had a thickness corresponding to several atoms by switching the electromagnet 28 according to the elements to be deposited at a predetermined current value. Preferably, a single layer had a thickness corresponding to a single atom (a single layer is deposited within 10 seconds). Each of the films was a thin film having a very small grain size of 5 nm or below, particularly, about 1 nm. The closest packed surface, (110), for a body-centered cubic lattice and, (100), for a face centered cubic lattice, was formed on the deposited surface. Thus, highly corrosion-resistant films were formed.

Particularly, whereas the film formed by conventional sputtering has a thickness of about 1 μm, the magnetoresistant effect film 40 of this embodiment has a thickness of 0.02 μm while having the magnetically equivalent characteristics to those of the conventional film. Therefore, a high performance reading can be achieved.

Electrodes for a magnetic head were formed using W in place of Nb by IBD in the same manner as the above-described example. After oxide $WO_3$ was ionized by a carbon tetrachloride steam plasma, W184 was selectively deposited on the soft film 55 at a position of the electrodes 60 shown in FIG. 11. Conventionally, W electrodes were corroded during the polishing/washing process of the element surface. However, the electrodes formed according to this method were highly corrosion-resistant and highly reliable because the specific resistance thereof substantially did not increase after the polishing/washing process and was 15 μΩcm or below.

In another example, after the shield films 110 and 80, the magnetoresistive effect film 40 and the soft film 55 were formed by sputtering from Permalloy, iron 58 having a purity of 99.999% and (110) plane and grain size of 5 nm was deposited under the conditions of Example No. 7 in the first embodiment. In this way, a magnetic head having a high corrosion-resistance and high sensitivity was obtained.

What is claimed is:

1. A member resistant to electrochemical corrosion which comprises a metallic thin film formed on a surface of a substrate, said film consisting essentially of a metal of a single mass number or an alloy of a combination of different metals, each different metal having a single mass number.

2. A member resistant to electrochemical corrosion which comprises a metallic thin film formed on a surface of a substrate, said thin film being formed by ion beam deposition and having a surface with a close packed crystal structure and having a crystal grain size of not greater than 5 μm, said thin film consisting essentially of a metal of a single mass number or an alloy of a combination of different metals, each different metal having a single mass number.

3. A member resistant to electrochemical corrosion according to claim 2, wherein said thin film consists of a metal having a single mass number, the content of which is largest among those isotopes of the metal which occur in nature.

4. A member resistant to electrochemical corrosion according to claim 3, wherein said metal of a single mass number is an isotope selected from the group consisting of Si28, Mg24, Al27, Ti48, V51, Cr52, Mn55, Fe56, Ni58, Cu63, Zr90, Nb93, Mo98, Ru102, Ag107, Hf180, Ta181 and W184.

5. A thin film of pure iron having resistance to electrochemical corrosion, said thin film being formed on an electroconductive substrate and having a surface crystal structure oriented in the (110) plane, said thin film consisting essentially of a metal of a single mass number or an alloy of a combination of different metals, each different metal having a single mass number.

6. The thin film of claim 5, wherein said iron has a mass number of Fe56 or Fe57.

* * * * *